United States Patent
Liu et al.

(10) Patent No.: US 12,464,950 B2
(45) Date of Patent: Nov. 4, 2025

(54) ELECTROMECHANICAL RESPONSIVE FILM, STACKED ARRANGEMENT AND METHODS OF FORMING THE SAME

(71) Applicant: Agency for Science, Technology and Research, Singapore (SG)

(72) Inventors: Huajun Liu, Singapore (SG); Kui Yao, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 922 days.

(21) Appl. No.: 17/623,380

(22) PCT Filed: Jun. 30, 2020

(86) PCT No.: PCT/SG2020/050376
§ 371 (c)(1),
(2) Date: Dec. 28, 2021

(87) PCT Pub. No.: WO2021/040614
PCT Pub. Date: Mar. 4, 2021

(65) Prior Publication Data
US 2022/0367787 A1   Nov. 17, 2022

(30) Foreign Application Priority Data
Aug. 30, 2019  (SG) ............................ 10201908039P

(51) Int. Cl.
*H01L 41/187*  (2006.01)
*C01G 33/00*  (2006.01)
(Continued)

(52) U.S. Cl.
CPC ....... *H10N 30/8542* (2023.02); *C01G 33/006* (2013.01); *C23C 14/083* (2013.01);
(Continued)

(58) Field of Classification Search
CPC ......................... H10N 30/8542; H10N 30/877
See application file for complete search history.

(56) References Cited

U.S. PATENT DOCUMENTS 8,450,911 B2   5/2013   Shibata et al.
8,961,679 B2   2/2015   Goh et al.
(Continued)

OTHER PUBLICATIONS

International Search Report for International Application No. PCT/SG2020/050376 dated Oct. 26, 2020, pp. 1-4.
(Continued)

*Primary Examiner* — Bryan P Gordon
(74) *Attorney, Agent, or Firm* — Shackelford, McKinley & Norton, LLP

(57) ABSTRACT

Various embodiments may provide an electromechanical responsive film. The electromechanical responsive film may include a composition including sodium (Na), potassium (K), niobium (Nb) and oxygen (O). The composition may have a formula $(Na_xK_y)NbO_{3-\delta}$, wherein $0 \leq x < 1$, wherein $0 \leq y < 1$, and wherein $0 < x+y < 1$. The composition may satisfy at least one condition selected from a group consisting of a first condition of $(x+y+4)/2 \leq (3-\delta) \leq (x+y+5)/2$ and a second condition of $0 < \delta < 1$.

20 Claims, 13 Drawing Sheets

(51) Int. Cl.
  *C23C 14/08* (2006.01)
  *C30B 23/02* (2006.01)
  *C30B 29/30* (2006.01)
  *C30B 29/32* (2006.01)
  *H10N 30/074* (2023.01)
  *H10N 30/076* (2023.01)
  *H10N 30/853* (2023.01)
  *H10N 30/87* (2023.01)

(52) U.S. Cl.
  CPC ............ *C30B 23/025* (2013.01); *C30B 29/30* (2013.01); *C30B 29/32* (2013.01); *H10N 30/074* (2023.02); *H10N 30/076* (2023.02); *H10N 30/877* (2023.02); *C01P 2002/50* (2013.01); *C01P 2002/72* (2013.01); *C01P 2002/76* (2013.01); *C01P 2006/36* (2013.01); *C01P 2006/40* (2013.01)

(56) References Cited

U.S. PATENT DOCUMENTS

| | | | |
|---|---|---|---|
| 2015/0115771 A1* | 4/2015 | Konoma | C30B 29/52 117/106 |
| 2017/0345992 A1* | 11/2017 | Noguchi | H10N 30/50 |
| 2018/0138394 A1* | 5/2018 | Kitada | B41J 2/14233 |
| 2018/0233656 A1* | 8/2018 | Kitada | H10N 30/20 |
| 2018/0287048 A1* | 10/2018 | Kitada | B41J 2/14233 |

OTHER PUBLICATIONS

Written Opinion of the International Searching Authority for International Application No. PCT/SG2020/050376 dated Oct. 26, 2020, pp. 1-5.

Ahn et al., "The Effect of K and Na Excess on the Ferroelectric and Piezoelectric Properties of K0.5Na0.5NbO3 Thin Films," Journal of Physics D: Applied Physics, vol. 42, 2009, pp. 1-5.

Bell et al., "Lead-Free Piezoelectrics—The Environmental and Regulatory Issues," MRS Bulletin, vol. 43, No. 8, 2018, pp. 581-587.

Wang et al., "Outstanding Piezoelectric Performance in Lead-Free 0.95(K,Na)(Sb,Nb)O3—0.05(Bi,Na,K)ZrO3 Thick Films with Oriented Nanophase Coexistence," Advanced Electronic Materials, vol. 5, No. 4, 1800691, 2019, pp. 1-7.

Yao et al., "Measurement of Longitudinal Piezoelectric Coefficient of Thin Films by a Laser-Scanning Vibrometer," IEEE Transactions on Ultrasonics, Ferroelectrics and Frequency Control, vol. 50, No. 2, Feb. 2003, pp. 113-116.

RoHS Guide, "2022 RoHS Compliance Guide," https://www.rohsguide.com, 2022, pp. 1-2.

Shibata et al., "Improvement of Piezoelectric Properties of (K,Na)NbO3 Films Deposited by Sputtering," Japanese Journal of Applied Physics, vol. 50, 041503, 2011, pp. 1-7.

Zhang et al., "Potassium-Sodium-Niobate-Based Thin Films: Lead Free for Micro-Piezoelectrics," Ann. Phys. (Berlin), 1800525, 2019, pp. 1-18.

Chow et al., "Epitaxial KNbO3 Thin Films on KTaO3, MgAl2O4, and MgO Substrates," Applied Physics Letters, vol. 65, No. 9, Aug. 29, 1994, pp. 1073-1075.

Reznichenko et al., "Properties of Nonstoichiometric Sodium Niobate," Technical Physics, vol. 47, No. 3, Mar. 31, 2002, pp. 325-329.

Liu et al., "Giant Piezoelectricity in Oxide Thin Films with Nanopillar Structure," Science, vol. 369, No. 6501, Jul. 17, 2020, pp. 292-297.

* cited by examiner

FIG. 2A electromechanical responsive film having a composition including sodium (Na), potassium (K), niobium (Nb) and oxygen (O)

200

FIG. 2B form the electromechanical responsive film such that the electromechanical responsive film has a composition including sodium (Na), potassium (K), niobium (Nb) and oxygen (O)

202

US 12,464,950 B2

ELECTROMECHANICAL RESPONSIVE FILM, STACKED ARRANGEMENT AND METHODS OF FORMING THE SAME

CROSS-REFERENCE TO RELATED APPLICATION

This application claims the benefit of priority of Singapore application No. 10201908039P filed on Aug. 30, 2019, the contents of it being hereby incorporated by reference in its entirety for all purposes.

TECHNICAL FIELD

Various aspects of this disclosure relate to an electromechanical responsive film. Various aspects of this disclosure relate to a stacked arrangement. Various aspects of this disclosure relate to a method of forming an electromechanical responsive film. Various aspects of this disclosure relate to a method of forming a stacked arrangement.

BACKGROUND

Materials with electromechanical response, particularly piezoelectric materials that can reversibly convert electrical energy into mechanical energy, are valuable in many applications as actuators, sensors, and transducers for ultrasonic devices. Lead zirconate titanate (PZT) is the dominant piezoelectric material in commercial products for 60 years, with increasing market worth (>than 20 billion United States dollars (USD) per annual currently). However, PZT contains lead. The weight percentage of lead (Pb) in PZT is about 64 percent.

The environmental and health concerns of toxic lead-based compositions are resulting in regulations that will eventually ban PZT in the future for many applications in regions such as the European Union (EU). According to the EU Restriction of Hazardous Substances (RoHS), lead content should be less than 1000 ppm or 0.1% to be RoHS compliant. Therefore, it is critical to develop lead-free alternatives to replace PZT in commercial products.

SUMMARY

Various embodiments may provide an electromechanical responsive film. The electromechanical responsive film may include a composition including sodium (Na), potassium (K), niobium (Nb) and oxygen (O). The composition may have a formula $(Na_xK_y)NbO_{3-\delta}$, wherein $0 \leq x < 1$, wherein $0 \leq y < 1$, and wherein $0 < x+y < 1$. The composition may satisfy at least one condition selected from a group consisting of a first condition of $(x+y+4)/2 \leq (3-\delta) \leq (x+y+5)/2$ and a second condition of $0 < \delta < 1$.

Various embodiments may relate to a stacked arrangement. The stacked arrangement may include an electromechanical responsive film. The electromechanical responsive film may include a composition including sodium (Na), potassium (K), niobium (Nb) and oxygen (O). The composition may have a formula $(Na_xK_y)NbO_{3-\delta}$, wherein $0 \leq x < 1$, wherein $0 \leq y < 1$, and wherein $0 < x+y < 1$. The composition may satisfy at least one condition selected from a group consisting of a first condition of $(x+y+4)/2 \leq (3-\delta) \leq (x+y+5)/2$ and a second condition of $0 < \delta < 1$.

Various embodiments may provide a method of forming an electromechanical responsive film. The method may include forming the electromechanical responsive film such that the electromechanical responsive film includes a composition including sodium (Na), potassium (K), niobium (Nb) and oxygen (O). The composition may have a formula $(Na_xK_y)NbO_{3-\delta}$, wherein $0 \leq x < 1$, wherein $0 \leq y < 1$, and wherein $0 < x+y < 1$. The composition may satisfy at least one condition selected from a group consisting of a first condition of $(x+y+4)/2 \leq (3-\delta) \leq (x+y+5)/2$ and a second condition of $0 < \delta < 1$.

Various embodiments may relate to a method of forming a stacked arrangement. The method may include forming an electromechanical responsive film. The electromechanical responsive film may include a composition including sodium (Na), potassium (K), niobium (Nb) and oxygen (O). The composition may have a formula $(Na_xK_y)NbO_{3-\delta}$, wherein $0 \leq x < 1$, wherein $0 \leq y < 1$, and wherein $0 < x+y < 1$. The composition may satisfy at least one condition selected from a group consisting of a first condition of $(x+y+4)/2 \leq (3-\delta) \leq (x+y+5)/2$ and a second condition of $0 < \delta < 1$.

BRIEF DESCRIPTION OF THE DRAWINGS

The invention will be better understood with reference to the detailed description when considered in conjunction with the non-limiting examples and the accompanying drawings, in which:

FIG. 2A is a general illustration of an electromechanical responsive film according to various embodiments.

FIG. 2B is a general illustration of a method of forming an electromechanical responsive film according to various embodiments.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized, and logical changes may be made without departing from the scope of the invention. The various embodiments are not necessarily mutually exclusive, as some embodiments can be combined with one or more other embodiments to form new embodiments.

Embodiments described in the context of one of the methods or films/arrangements are analogously valid for the other methods or films/arrangements. Similarly, embodiments described in the context of a method are analogously valid for a film/arrangement, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The device as described herein may be operable in various orientations, and thus it should be understood that the terms "top", "bottom", etc., when used in the following description are used for convenience and to aid understanding of relative positions or directions, and not intended to limit the orientation of the film/arrangement.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Figure 1:
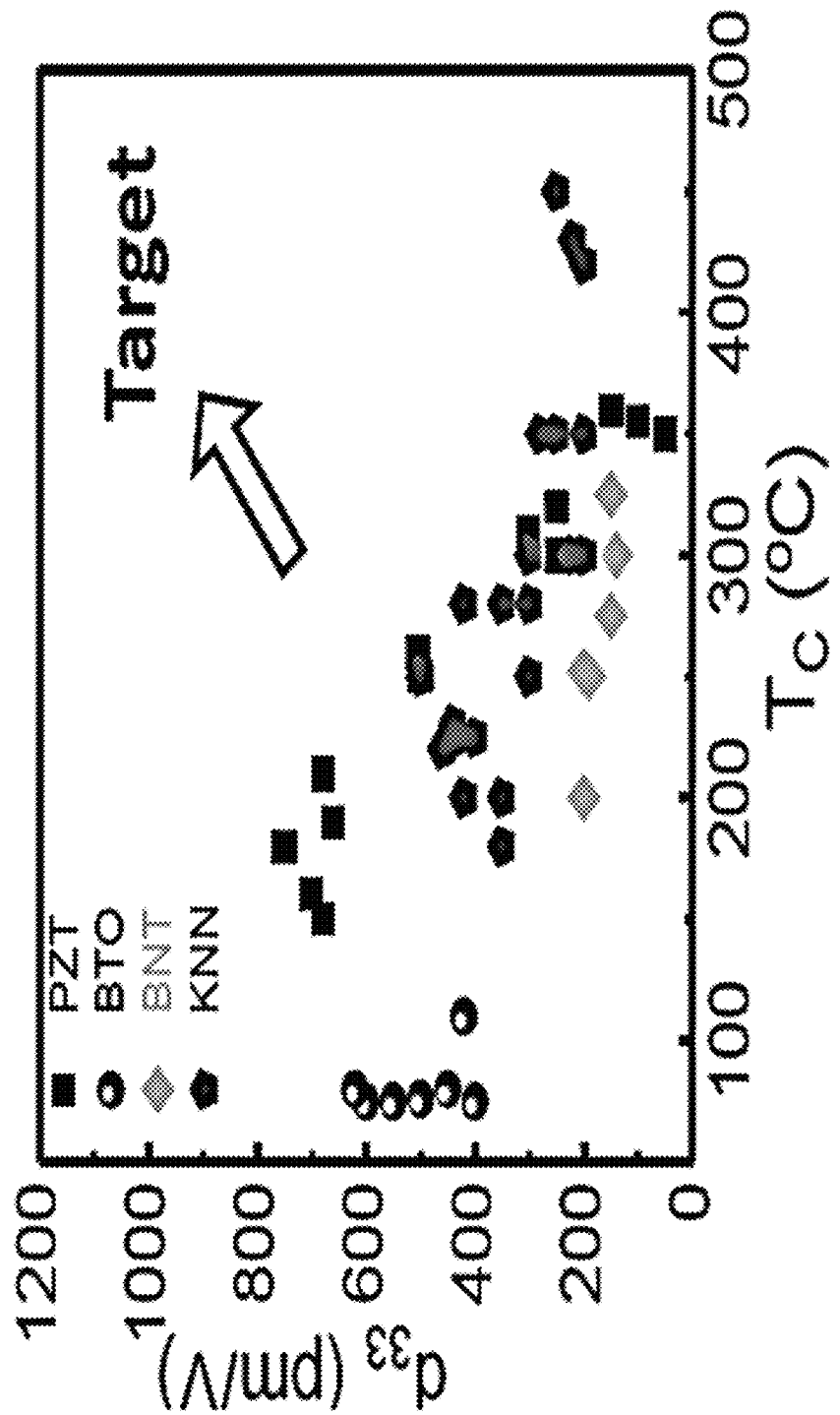
FIG. 1 is a plot of piezoelectric coefficient $d_{33}$ (in picometers per volt or pm/V) as a function of Curie temperature $T_c$ (in degree Celsius or °C.) showing the piezoelectric coefficients and Curie temperature of lead zirconate titanate (PZT), potassium sodium niobate (KNN), barium titanate (BTO), and bismuth sodium titanium oxide (BNT).

Many research works have been performed to identify lead-free materials with electromechanical properties comparable to that of PZT. A key performance parameter is the effective piezoelectric coefficient $d_{33}$ which measures the mechanical strain induced by applied electric field, or mechanical displacement induced by applied voltage. Among all the lead-free candidates, potassium sodium niobate (KNN) is one of the most promising candidates with its relatively high piezoelectric coefficient and high Curie temperature. In micro electromechanical system (MEMS) applications, the best performance of lead-free film achieved so far is that of extensively doped KNN based thin films with effective piezoelectric coefficient $d_{33}$ of 250 pm/V. FIG. 1 is a plot of piezoelectric coefficient $d_{33}$ (in picometers per volt or pm/V) as a function of Curie temperature $T_c$ (in degree Celsius or °C.) showing the piezoelectric coefficients and Curie temperature of lead zirconate titanate (PZT), potassium sodium niobate (KNN), barium titanate (BTO), and bismuth sodium titanium oxide (BNT).

FIG. 2A is a general illustration of an electromechanical responsive film 200 according to various embodiments. The electromechanical responsive film 200 may include a composition including sodium (Na), potassium (K), niobium (Nb) and oxygen (O). The composition may have a formula $(Na_xK_y)NbO_{3-\delta}$, wherein 0≤x<1, wherein 0≤y<1, and wherein 0<x+y<1. The composition may satisfy at least one condition selected from a group consisting of a first condition of $(x+y+4)/2 \leq (3-\delta) \leq (x+y+5)/2$ and a second condition of 0<δ<1.

In other words, various embodiments may relate to a film 200 with the chemical composition of $(Na_xK_y)NbO_{3-\delta}$. The formula may satisfy the conditions 0≤x<1, 0≤y<1, and 0<x+y<1. The formula may also satisfy the conditions $(x+y+4)/2 \leq (3-\delta) \leq (x+y+5)/2$ and/or 0<δ<1.

For avoidance of doubt, FIG. 2A serves to only provide a general illustration and does not limit the shape, size, dimensions, orientation etc. of the film. While FIG. 2A shows flat, parallel surfaces, various embodiments may have non-parallel, uneven surfaces.

Various embodiments may relate to a lead-free electrochemical responsive alkaline niobate thin film.

In conventional methods, as potassium (K) and sodium (Na) are highly volatile, the composition of K and Na in the conventional film usually tends to be less than the designed ratio in the target. To compensate the loss of K and Na, researchers will usually add excess amount of K and Na in the target, like 10% excess, so that the final composition is close to the chemical stoichiometry, as what is usually designed. However, in various embodiments, the amount of K and Na in the target is reduced to explore K and Na deficient thin films, instead of excess K and Na. This design strategy has not been previously reported. Additionally, as K and Na are highly volatile, it may be very challenging to control the final stoichiometry, which depends on many processing conditions. The growth conditions, like temperature, gas pressure, sputtering power, may need be optimized to obtain the films with the desired structure containing K, Na deficiencies and associated high performance. These conditions may depend on the growth system, and may not be likely to be directly applied in other growth systems. The composition with defects may be a composition selected from ranges as defined by $((Na_xK_y)NbO_{3-\delta}$ wherein 0≤x<1, 0≤y<1, 0<x+y<1, $(x+y+4)/2 \leq (3-\delta) \leq (x+y+5)/2$ and/or 0<δ<1). Various embodiments may have an outstanding effective piezoelectric performance as a result of the composition.

In various embodiments, the electromechanical responsive film 200 may be an epitaxial film. In various other embodiments, the electromechanical responsive film may be a polycrystalline film.

In various embodiments, the electromechanical responsive film 200 may have an effective longitudinal piezoelectric strain coefficient ($|d_{33}|$) higher than 250 pm/V. In various embodiments, the effective longitudinal piezoelectric strain coefficient ($|d_{33}|$) may be higher than 500 pm/V.

Various embodiments may have an effective longitudinal piezoelectric strain coefficient $|d_{33}|$ of >800 pm/V. Roughly, effective $|d_{33}|$ may be 2 times of the value of $|d_{31}|$, which gives $|d_{31}|$>400 pm/V.

In various embodiments, x may be equal to 0. In other words, the formula of the composition may be $(K_y)NbO_{3-\delta}$. In various embodiments, y may be equal to 0. In other words, the formula of the composition may be $(Na_x)NbO_{3-\delta}$.

In various embodiments, the formula may be $Na_{0.86}NbO_{2.93}$.

In various embodiments, the formula may be $(K_{0.17}Na_{0.65})NbO_{2.91}$.

In various embodiments, the electromechanical responsive film 200 may have a ferroelectric phase—paraelectric phase transition temperature of more than 400° C., e.g. about 450° C. The electromechanical response may be lost in paraelectric phase above the transition temperature. Thus, if the ferroelectric phase—paraelectric phase transition temperature is higher, the film 200 may be electromechanical responsive in a wider range of temperatures. The transition temperature of 450° C. may be highest amongst reported literature on the piezoelectric materials with substantially large piezoelectric strain coefficient.

In various embodiments, the electromechanical responsive film 200 may have an orthorhombic phase—tetragonal phase transition temperature of above 150° C., e.g. above 200° C., e.g. about 210° C.

In various embodiments, the electromechanical responsive film 200 may have a thickness of any value selected from 50 nm to 10 pm.

Various embodiments may relate to a stacked arrangement. The stacked arrangement may include an electromechanical responsive film as described herein. The electromechanical responsive film may include a composition including sodium (Na), potassium (K), niobium (Nb) and oxygen (O). The composition may have a formula $(Na_xK_y)NbO_{3-\delta}$, wherein $0 \leq x<1$, wherein $0 \leq y<1$, and wherein $0<x+y<1$. The composition may satisfy at least one condition selected from a group consisting of a first condition of $(x+y+4)/2 \leq (3-\delta) \leq (x+y+5)/2$ and a second condition of $0<\delta<1$.

Various embodiments may relate to a stacked arrangement including two electrode layers. In various embodiments, the stacked arrangement may include a substrate. The stacked arrangement may also include a first electrode layer (alternatively called a bottom electrode layer) on the substrate. The stacked arrangement may further include a second electrode layer (alternatively called a top electrode layer) such that the electromechanical responsive film is between the first electrode layer and the second electrode layer.

For instance, the electromechanical responsive film may be or may include a polycrystalline film including a suitable material, such as $Na_{0.86}NbO_{2.93}$. The substrate may be or may include a silicon wafer including a silicon oxide layer. The first electrode layer or bottom electrode layer may include platinum (Pt).

The electromechanical responsive film may alternatively be an epitaxial film. The crystal structure as well as the lattice parameters of the substrate and the first electrode layer or bottom electrode layer may be similar to that of the electromechanical responsive film.

Epitaxial thin films have single crystal-like structure with single orientation of crystal structure. They are usually grown on single crystal substrates with similar lattice symmetry and parameters, which serve as template for the epitaxial film growth. Therefore, the crystal structure and lattice parameters of the substrates have to be very close to the film. On the other hand, polycrystalline films have random orientations of crystal structure, and may include multiple grains with different orientations. As the lattice parameter and crystal structure of lead-free thin films are very different from the underlying substrate (e.g. silicon (Si) wafer), the film may not be able to be grown on Si wafer in just one single orientation, but may have randomly oriented multiple grains. The difference of the microstructure between an epitaxial film and a polycrystalline film may lead to different properties. Generally speaking, it may be possible to grow an epitaxial thin film on Si wafer, if the structure of the thin film is close to Si. For lead-free electrochemical responsive alkaline niobate films grown on single crystal oxide substrates with similar lattice structure and parameters, epitaxial thin films may be formed when the growth condition is well controlled to achieve high quality growth. However, if the growth condition is not properly controlled, polycrystalline films may possibly be obtained instead, even if the lattice and structure match with the substrates.

Various embodiments may relate to a stacked arrangement including a single electrode layer. In various other embodiments, the stacked arrangement may include a substrate, and an electrode layer such that the electromechanical responsive film is between the electrode layer and the substrate. The substrate may be an electrically conductive substrate.

For instance, the substrate may be or may include a single crystal of a suitable material, e.g. niobium-doped strontium titanate (Nb-doped $SrTiO_3$), and the electromechanical responsive film may be or may include an epitaxial film of a suitable material, e.g. $Na_{0.86}NbO_{2.93}$ or $(K_{0.17}Na_{0.65})NbO_{2.91}$. The electromechanical responsive film may alternatively be a polycrystalline film.

FIG. 2B is a general illustration of a method of forming an electromechanical responsive film according to various embodiments. The method may include, in 202, forming the electromechanical responsive film such that the electromechanical responsive film includes a composition including sodium (Na), potassium (K), niobium (Nb) and oxygen (O). The composition may have a formula $(Na_xK_y)NbO_{3-\delta}$, wherein $0 \leq x<1$, wherein $0 \leq y<1$, and wherein $0<x+y<1$. The composition may satisfy at least one condition selected from a group consisting of a first condition of $(x+y+4)/2 \leq (3-5) \leq (x+y+5)/2$ and a second condition of $0<\delta<1$.

In various embodiments, the electromechanical responsive film may be formed over a substrate via sputtering. Various embodiments may also relate to other fabrication techniques, as long as the composition and alkaline-deficient structure are properly controlled by the processing parameters. However, the conditions using the different fabrication techniques to achieve the same compositions and structure may be very different.

In various embodiments, the electromechanical responsive film may be an epitaxial film. In various other embodiments, the electromechanical responsive film may be a polycrystalline film.

In various embodiments, the electromechanical responsive film has an effective longitudinal piezoelectric strain coefficient ($|d_{33}|$) higher than 250 pm/V. In various embodiments, the effective longitudinal piezoelectric strain coefficient ($|d33|$) may be higher than 500 pm/V.

Various embodiments may have an effective longitudinal piezoelectric strain coefficient $|d_{33}|$ of >800 pm/V. Roughly, effective $|d_{33}|$ may be 2 times of the value of $|d_{31}|$, which gives $|d_{31}|$>400 pm/V.

In various embodiments, x may be equal to 0.

In various embodiments, y may be equal to 0.

In various embodiments, the formula may be $Na_{0.86}NbO_{2.93}$.

In various embodiments, the formula may be $(K_{0.17}Na_{0.65})NbO_{2.91}$.

In various embodiments, the electromechanical responsive film 200 may have a ferroelectric phase—paraelectric phase transition temperature of more than 400° C., e.g. about 450° C.

In various embodiments, the electromechanical responsive film 200 may have an orthorhombic phase—tetragonal phase transition temperature of above 150° C., e.g. above 200° C., e.g. about 210° C.

In various embodiments, the electromechanical responsive film may have a thickness of any value selected from 50 nm to 10 pm.

Various embodiments may relate to a method of forming a stacked arrangement. The method may include forming an electromechanical responsive film as described herein. The electromechanical responsive film may include a composition including sodium (Na), potassium (K), niobium (Nb) and oxygen (O). The composition may have a formula $(Na_xK_y)NbO_{3-\delta}$, wherein $0 \leq x < 1$, wherein $0 \leq y < 1$, and wherein $0 < x+y < 1$. The composition may satisfy at least one condition selected from a group consisting of a first condition of $(x+y+4)/2 \leq (3-\delta) \leq (x+y+5)/2$ and a second condition of $0 < \delta < 1$.

In various embodiments, the method may further include forming a first electrode layer or bottom electrode layer on a substrate. The method may also include forming a second electrode layer or top electrode layer such that the electromechanical responsive film is between the first electrode layer and the second electrode layer. For instance, the substrate may be a silicon wafer including a silicon oxide layer. The bottom electrode may include platinum (Pt), and the electromechanical responsive film may be or may include a polycrystalline film, e.g. of $Na_{0.86}NbO_{2.93}$. Alternatively, the electromechanical responsive film may be an epitaxial film.

In various other embodiments, the electromechanical responsive film may be formed on a substrate. The method may also include forming an electrode layer such that the electromechanical responsive film is between the electrode layer and the substrate. For instance, the substrate may be or may include a single crystal of niobium-doped strontium titanate (Nb-doped $SrTiO_3$), and the electromechanical responsive film may be or may include an epitaxial film, e.g. of $Na_{0.86}NbO_{2.93}$ or $(K_{0.17}Na_{0.65})NbO_{2.91}$. Alternatively, the electromechanical responsive film may be a polycrystalline film.

Various embodiments may relate to alkaline deficient KNN thin films with the chemical composition of $(Na_xK_y)NbO_{3-\delta}$ ($0 \leq x < 1$, $0 \leq y < 1$, $0 < x+y < 1$, $(x+y+4)/2 \leq (3-\delta) \leq (x+y+5)/2$ or $0 < \delta < 1$), which shows a giant effective piezoelectric coefficient $d_{33} \sim 1098$ pm/V in epitaxial thin films. In polycrystalline thin film grown on a silicon (Si) wafer, the effective piezoelectric coefficient $d_{33}$ reaches ~1518 pm/V, more than 10 times of the state of art KNN films. These electromechanical responsive thin films with the unusually high effective piezoelectric performance may have great potential to replace PZT thin films in commercial products.

Epitaxial Thin Film

Figure 3A:
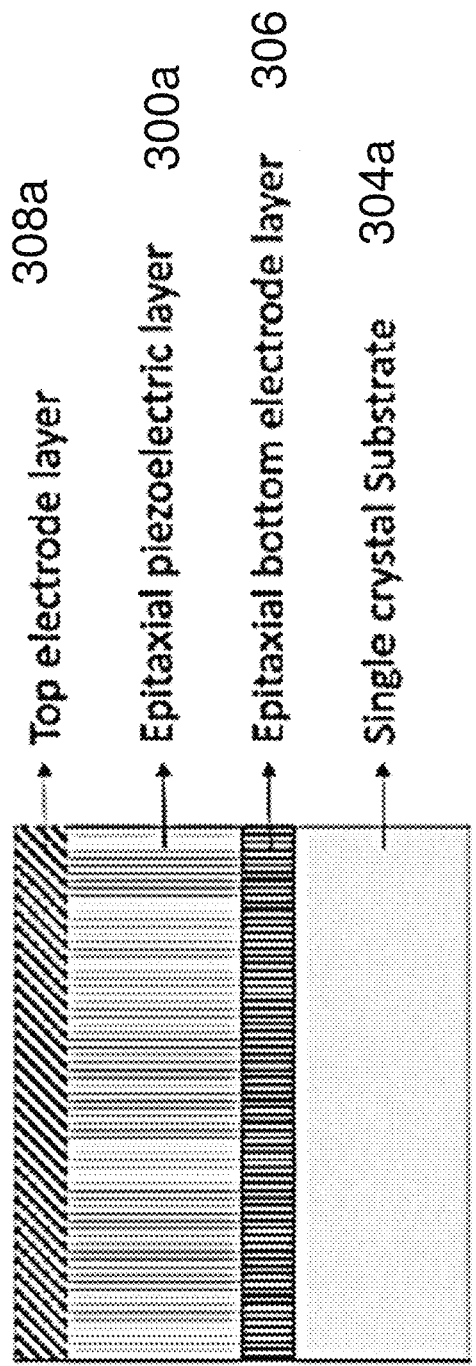
FIG. 3A is a schematic showing a stacked arrangement including an electromechanical responsive film according to various embodiments.
Figure 3B:
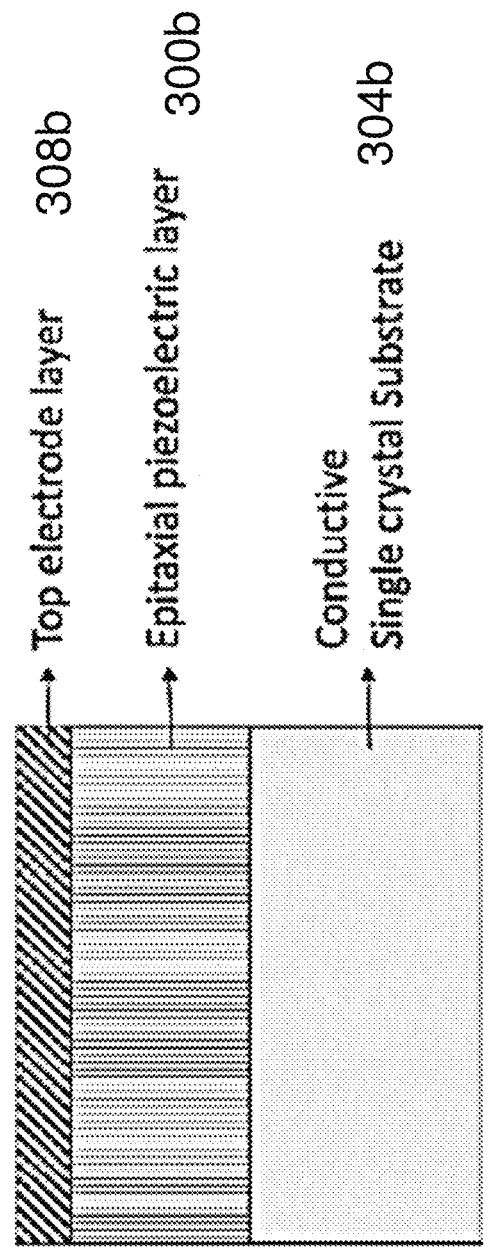
FIG. 3B is a schematic showing a stacked arrangement including an electromechanical responsive film according to various other embodiments.

FIG. 3A is a schematic showing a stacked arrangement including an electromechanical responsive film 300a according to various embodiments. FIG. 3B is a schematic showing a stacked arrangement including an electromechanical responsive film 300b according to various other embodiments.

In various embodiments, as shown in FIG. 3A, the electromechanical responsive film 300a may be grown over a single crystal substrate 304a with a bottom electrode layer 306. The arrangement may additionally include a top electrode layer 308a. The electromechanical responsive film 300a may be between the bottom electrode layer 306 and the top electrode layer 308a.

In various other embodiments, as shown in FIG. 3B, the electromechanical responsive film 300b may be grown directly on a single crystal substrate 304b. The arrangement may additionally include a top electrode layer 308b. The electromechanical responsive film 300a may be between the substrate 304b and the top electrode layer 308b.

The piezoelectric thin films 300a, 300b may have a lead-free alkaline niobate-based chemical composition, with alkaline deficient according to the formula of $(Na_xK_y)NbO_{3-\delta}$ ($0 \leq x < 1$, $0 \leq y < 1$, $0 < x+y < 1$, $(x+y+4)/2 \leq (3-\delta) \leq (x+y+5)/2$ or $0 < \delta < 1$). In various embodiments, the composition may also be with only one type of alkaline atoms, such as $Na_xNbO_{3-\delta}$ ($0 \leq x < 1$, $(x+4)/2 \leq (3-\delta) \leq (x+5)/2$), i.e. without potassium (K). The effective piezoelectric coefficient of the obtained film may be higher than 250 pm/V, e.g. higher than 500 pm/V.

The bottom electrode layer 306 shown in FIG. 3A may be an epitaxial layer. The top electrode layer 308a, and the top electrode layer 308b may include a suitable electrically conductive material, e.g. a metal such as platinum (Pt) or gold (Au). The bottom electrode layer 306 may include a suitable electrically conductive material. e.g. a conductive oxide with perovskite structure such as $SrRuO_3$, $LaNiO_3$ or $(La, Sr)MnO_3$.

Example 1: $Na_{0.86}NbO_{2.93}$ Epitaxial Thin Film

As an example, a $Na_{0.86}NbO_{2.93}$ epitaxial thin film has been grown on (001)-oriented niobium doped strontium titanate (Nb-doped $SrTiO_3$) substrate by sputtering. The film has been grown at 650° C. with argon (Ar):oxygen ($O_2$) ratio of 2:1, power of 100 W (3-inch target) and a pressure of 0.03 mbar. The film thickness is around 200 nm. In various embodiments, the film thickness may be in the range of 50 nm to 10 pm, depending on the growth condition and growth time. The chemical composition ($Na_{0.86}NbO_{2.93}$) is determined by X-ray photoemission spectroscopy (XPS).

Figure 4:
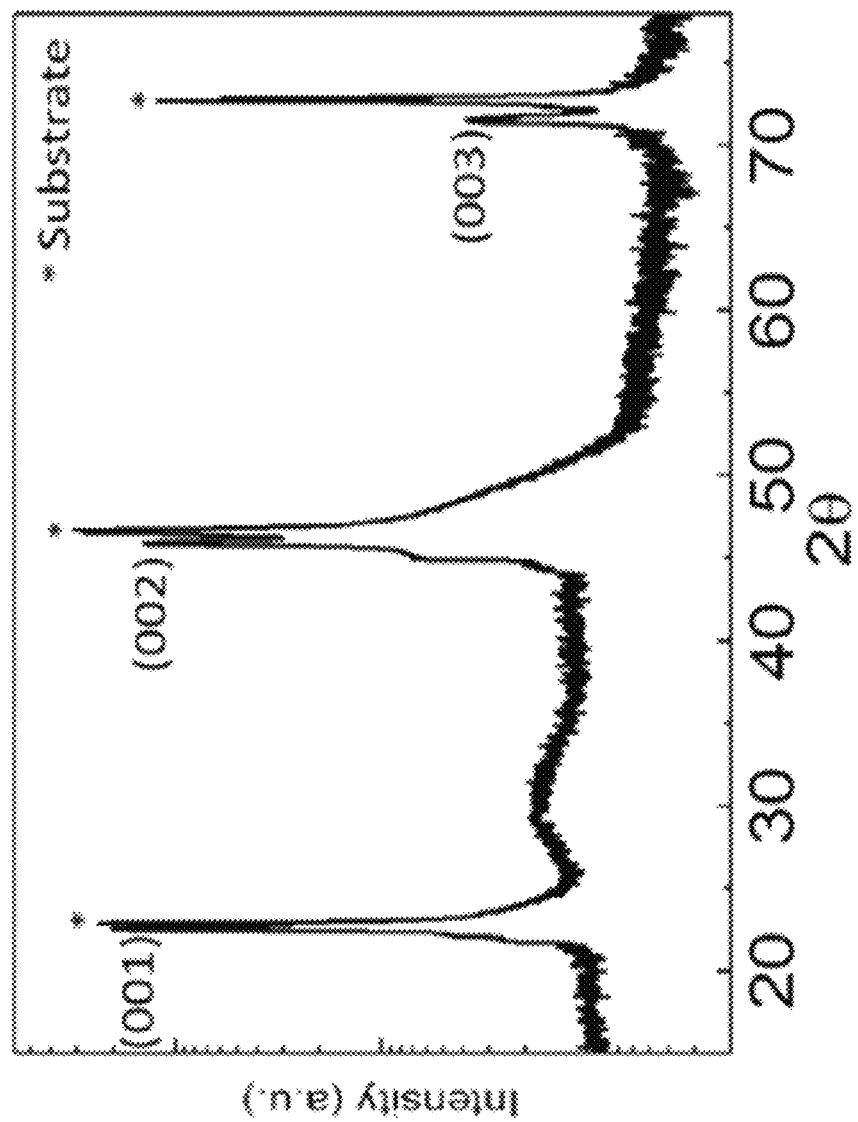
FIG. 4 is a plot of intensity (in arbitrary units or a.u.) as a function of angle (2θ) showing the X-ray diffraction pattern of epitaxial $Na_{0.86}NbO_{2.93}$ thin film on Nb-doped $SrTiO_3$ (001) substrate according to various embodiments.

FIG. 4 is a plot of intensity (in arbitrary units or a.u.) as a function of angle ($2\theta$) showing the X-ray diffraction pattern of epitaxial $Na_{0.86}NbO_{2.93}$ thin film on Nb-doped $SrTiO_3$ (001) substrate according to various embodiments. The X-ray diffraction pattern in FIG. 4 shows only diffraction peaks of (001), (002) and (003) for the epitaxial film. The electromechanical response and piezoelectric property are characterized with a laser scanning vibrometer, which measures the surface displacement due to the mechanical strain induced by the applied electrical field.

Figure 5:
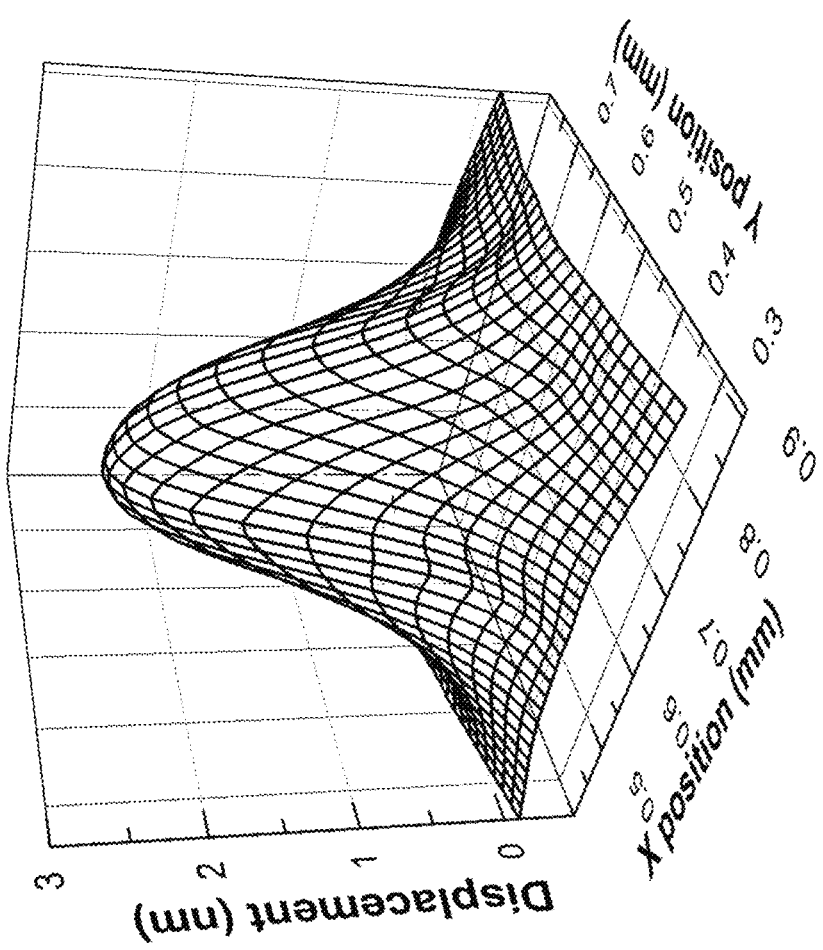
FIG. 5 is a three dimensional (3D) plot of surface displacement (in nanometers or nm) as a function of X position (in millimeters or mm) and Y position (in millimeters or mm) showing the surface displacement profile of epitaxial $Na_{0.86}NbO_{2.93}$ thin film according to various embodiments under an alternating current (AC) unipolar voltage of 2.5V.

The three-dimensional (3D) plot of surface displacement profile of the epitaxial thin film under alternating current (AC) unipolar voltage of 2.5 V in magnitude at 1 kHz is presented in FIG. 5. FIG. 5 is a three dimensional (3D) plot of surface displacement (in nanometers or nm) as a function of X position (in millimeters or mm) and Y position (in millimeters or mm) showing the surface displacement profile of epitaxial $Na_{0.86}NbO_{2.93}$ thin film according to various embodiments under an alternating current (AC) unipolar voltage of 2.5V. Based on the dilatation determined by the surface displacement value and voltage magnitude applied, the effective piezoelectric coefficient $d_{33}$ is well above 800 pm/V, up to ~1098 pm/V at 1 kHz. It is observed that the effective piezoelectric coefficient depends on the testing frequency, with a higher value at lower frequency.

Figure 6:
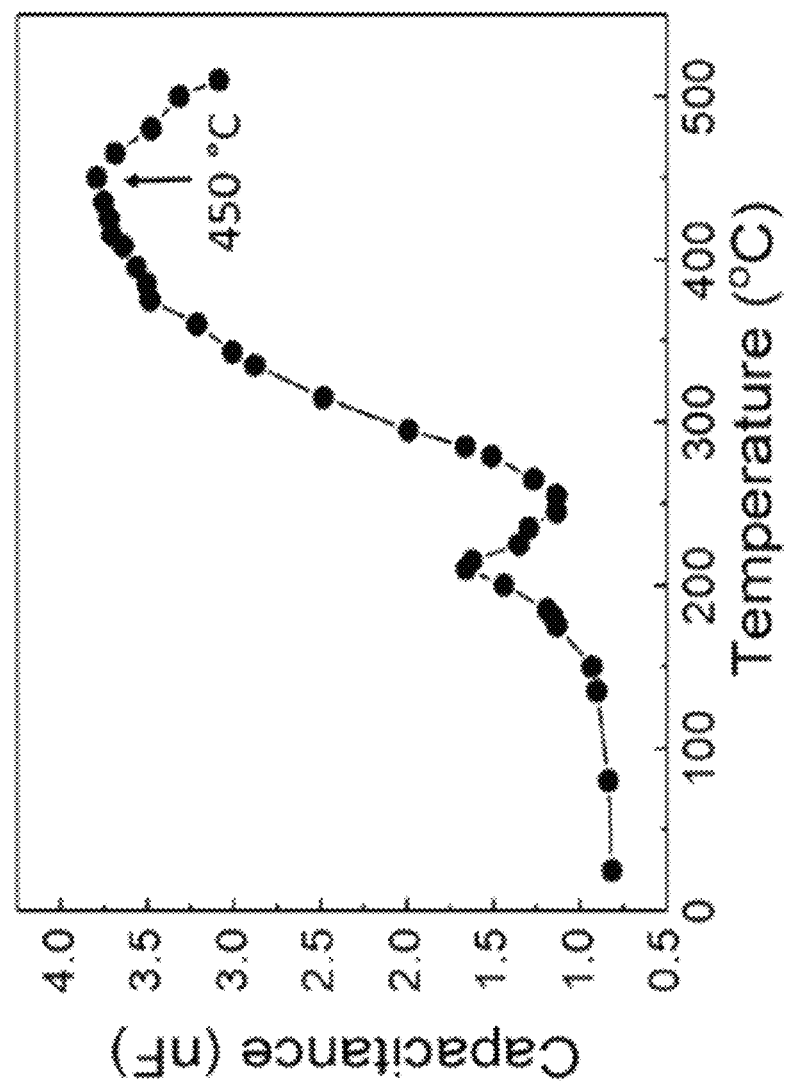
FIG. 6 is a plot of capacitance (in nanoFarads or nF) as a function of temperature (in degree Celsius or °C.) showing the temperature dependence of the capacitance of epitaxial $Na_{0.86}NbO_{2.93}$ thin film according to various embodiments in the temperature range of 25°C. to 510°C.

The phase transition behavior of the epitaxial thin films has also been investigated by temperature-dependent capacitance measurement. FIG. 6 is a plot of capacitance (in nanoFarads or nF) as a function of temperature (in degree Celsius or °C.) showing the temperature dependence of the capacitance of epitaxial $Na_{0.86}NbO_{2.93}$ thin film according to various embodiments in the temperature range of 25° C. to 510° C.

Example 2: $(K_{0.17}Na_{0.65})NbO_{2.91}$ Epitaxial Thin Film

As another example, $(K_{0.17}Na_{0.65})NbO_{2.91}$ epitaxial thin film has been grown on a (001)-oriented Nb-doped $SrTiO_3$ substrate via sputtering. The film has been grown at 650° C. with a ratio of $Ar:O_2$ of 2:1, power of 100 W (3-inch target) and a pressure of 0.03 mbar. The film thickness is around 200 nm. The chemical composition $((K_{0.17}Na_{0.65})NbO_{2.91})$ is determined by X-ray photoemission spectroscopy (XPS).

Figure 7:
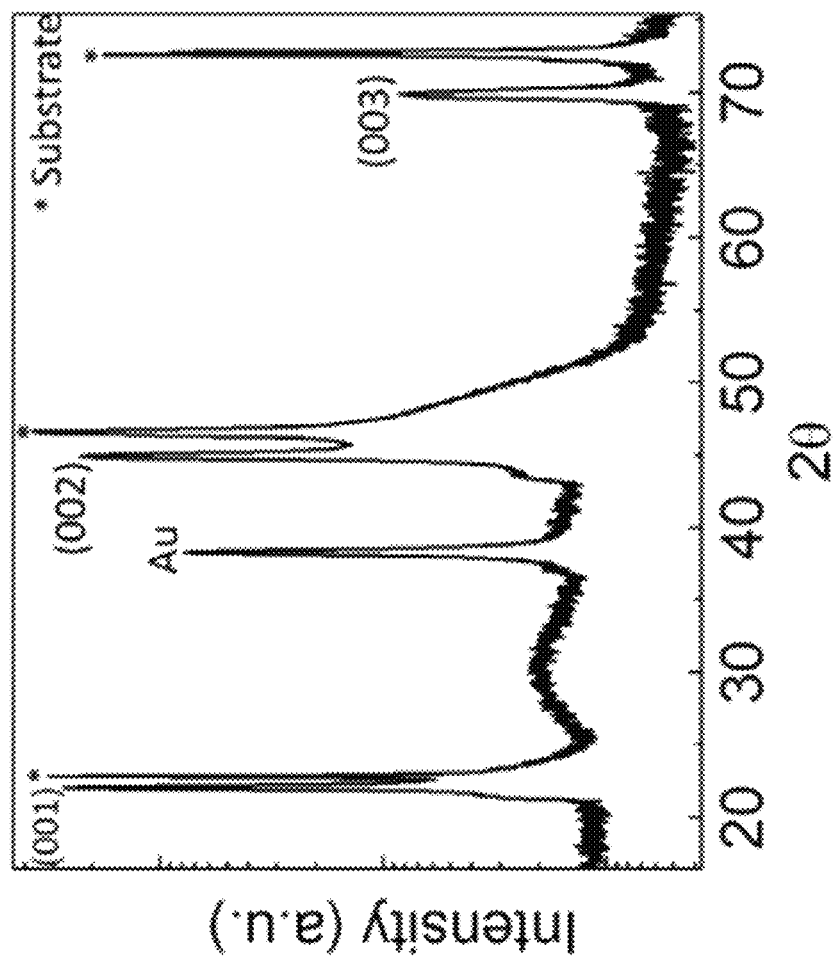
FIG. 7 is a plot of intensity (in arbitrary units or a.u.) as a function of angle (2θ) showing the X-ray diffraction pattern of epitaxial $(K_{0.17}Na_{0.6}s)NbO_{2.91}$ thin film on Nb-doped $SrTiO_3$ (001) substrate according to various embodiments.

FIG. 7 is a plot of intensity (in arbitrary units or a.u.) as a function of angle (2θ) showing the X-ray diffraction pattern of epitaxial $(K_{0.17}Na_{0.65})NbO_{2.91}$ thin film on Nb-doped $SrTiO_3$ (001) substrate according to various embodiments. The X-ray diffraction pattern in FIG. 7 shows the only diffraction peaks of (001), (002) and (003) for the epitaxial film as obtained. The peak near 38° is from the gold (Au) electrode.

Figure 8:
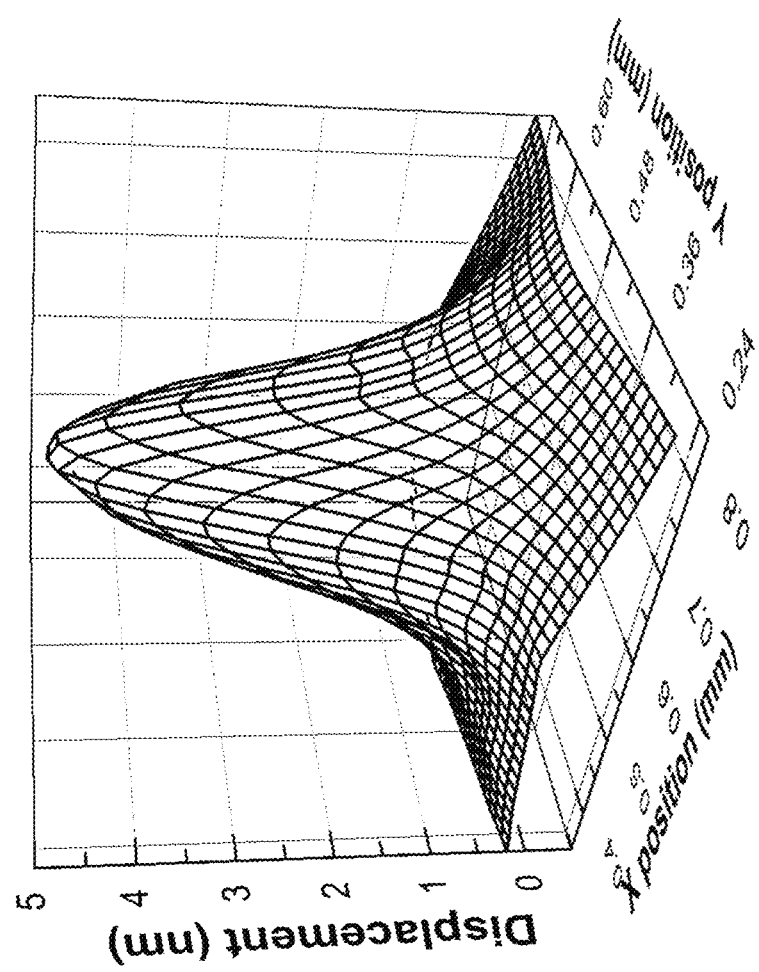
FIG. 8 is a three dimensional (3D) plot of surface displacement (in nanometers or nm) as a function of X position (in millimeters or mm) and Y position (in millimeters or mm) showing the surface displacement profile of epitaxial $(K_{0.17}Na_{0.65})NbO_{2.91}$ thin film according to various embodiments under an alternating current (AC) unipolar voltage of 5.5V.

The three dimensional (3D) plot of surface displacement profile of the epitaxial thin film under an alternating current (AC) unipolar voltage of 5.5 V in magnitude at 1 kHz is presented in FIG. 8. FIG. 8 is a three dimensional (3D) plot of surface displacement (in nanometers or nm) as a function of X position (in millimeters or mm) and Y position (in millimeters or mm) showing the surface displacement profile of epitaxial $(K_{0.17}Na_{0.65})NbO_{2.91}$ thin film according to various embodiments under an alternating current (AC) unipolar voltage of 5.5V. Based on the dilatation determined by the surface displacement value and voltage magnitude applied, the effective piezoelectric coefficient $d_{33}$ is ~758 pm/V at 1 kHz. It is also observed that the effective piezoelectric coefficient depends on the testing frequency, with higher value at lower frequency.

Polycrystalline Thin Film

Figure 9:
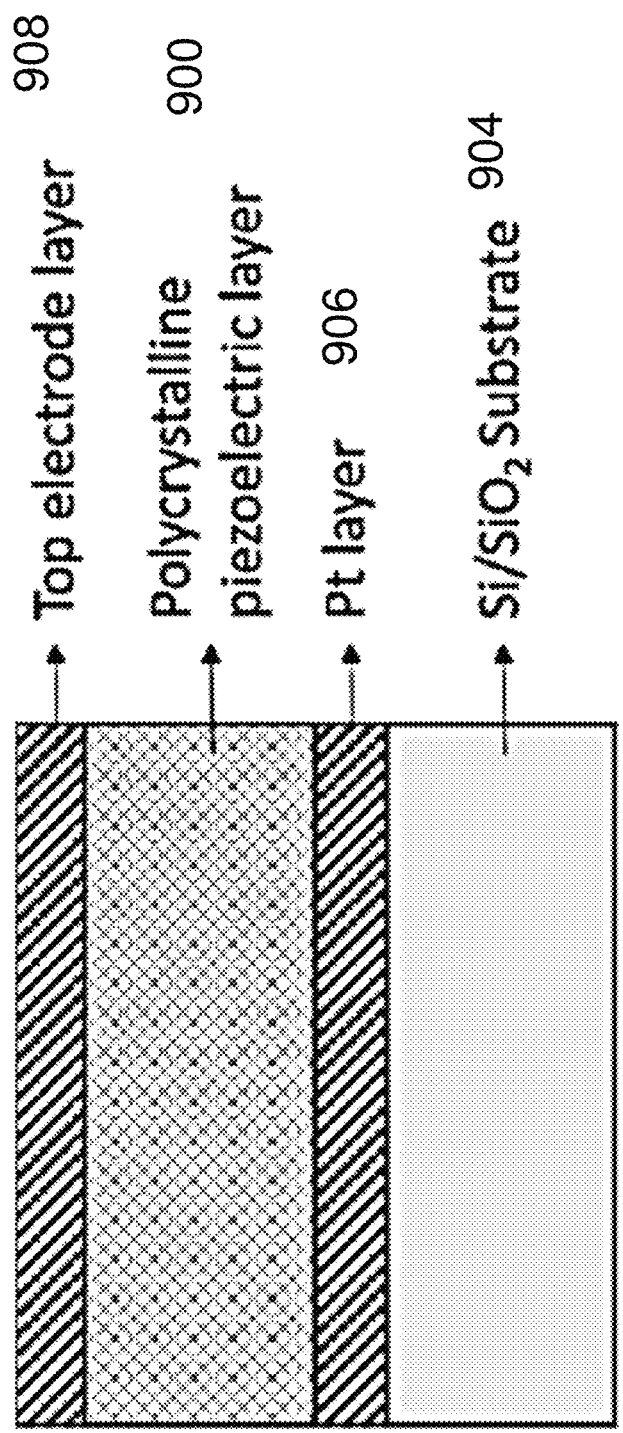
FIG. 9 is a schematic showing a stacked arrangement including an electromechanical responsive film according to various embodiments.

FIG. 9 is a schematic showing a stacked arrangement including an electromechanical responsive film 900 according to various embodiments.

In various embodiments, as shown in FIG. 9, the polycrystalline piezoelectric thin film 900 may be grown over a silicon (Si) wafer with silicon oxide ($SiO_2$) layer 904 with a bottom electrode layer 906. The arrangement may additionally include a top electrode layer 908. The film 900 may be between the bottom electrode layer 906 and the top electrode layer 908.

The piezoelectric thin film 900 may have a lead-free alkaline niobate-based chemical composition, with alkaline deficient according to the formula of $(Na_xK_y)NbO_{3-\delta}$ ($0 \leq x < 1$, $0 \leq y < 1$, $0 < x+y < 1$, $(x+y+4)/2 \leq (3-\delta) \leq (x+y+5)/2$ or $0 < \delta < 1$). In various embodiments, the composition may also be with only one type of alkaline atoms, such as $Na_xNbO_{3-\delta}$ ($0 \leq x < 1$, $(x+4)/2 \leq (3-\delta) \leq (x+5)/2$), i.e. without potassium (K).

In various embodiments, the bottom electrode layer 906 may include platinum (Pt). In various other embodiments, the bottom electrode layer 906 may include any other suitable electrically conductive material, e.g. a metal such as platinum (Pt), gold (Au) or a metal alloy. The top electrode layer 908 may include a suitable electrically conductive material, e.g. a metal such as platinum (Pt), gold (Au) or a metal alloy.

Example 3: $Na_{0.86}NbO_{2.93}$ Polycrystalline Thin Film

Figure 10:
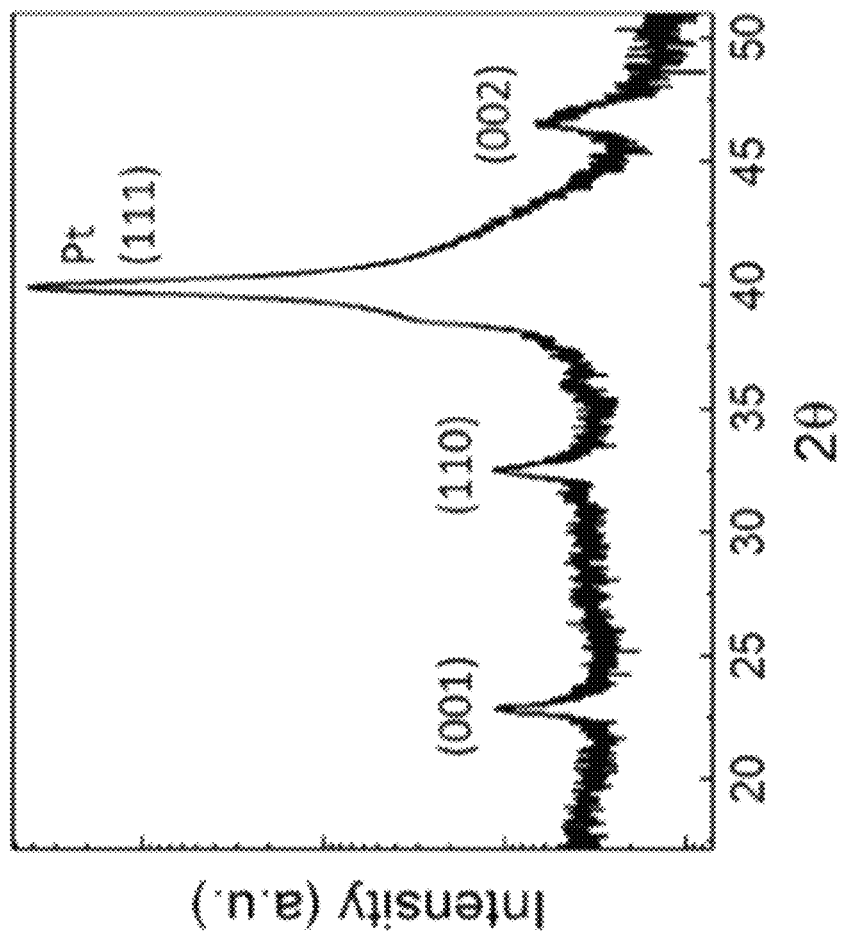
FIG. 10 is a plot of intensity (in arbitrary units or a.u.) as a function of angle (2θ) showing the X-ray diffraction pattern of polycrystalline $Na_{0.86}NbO_{2.93}$ thin film on silicon/silicon oxide/platinum (Si/SiO$_2$/Pt) substrate according to various embodiments.

As an example, the $Na_{0.86}NbO_{2.93}$ polycrystalline thin film has been grown by sputtering. The film has been grown at 650° C. with argon (Ar):oxygen ($O_2$) ratio of 2:1, power of 100 W (3-inch target) and a pressure of 0.03 mbar. The film thickness is around 200 nm. The chemical composition ($Na_{0.86}NbO_{2.93}$) is determined by X-ray photoemission spectroscopy (XPS). FIG. 10 is a plot of intensity (in arbitrary units or a.u.) as a function of angle (2θ) showing the X-ray diffraction pattern of polycrystalline $Na_{0.86}NbO_{2.93}$ thin film on silicon/silicon oxide/platinum ($Si/SiO_2/Pt$) substrate according to various embodiments. Diffraction peaks of (001), (110) and (002) are observed, showing the random crystal orientation.

Figure 11:
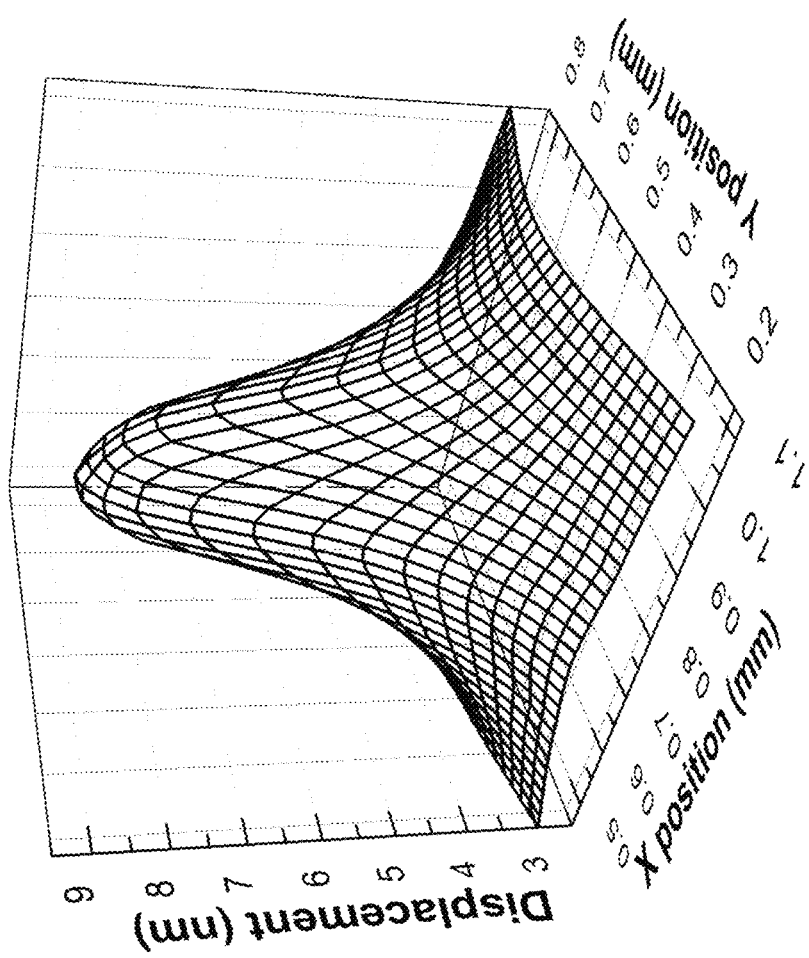
FIG. 11 is a three dimensional (3D) plot of surface displacement (in nanometers or nm) as a function of X position (in millimeters or mm) and Y position (in millimeters or mm) showing the surface displacement profile of polycrystalline $Na_{0.86}NbO_{2.93}$ thin film according to various embodiments under an alternating current (AC) unipolar voltage of 4V.

The three dimensional (3D) plot of surface displacement profile of the polycrystalline thin film under an alternating current (AC) unipolar voltage of 4 V is presented in FIG. 11. FIG. 11 is a three dimensional (3D) plot of surface displacement (in nanometers or nm) as a function of X position (in millimeters or mm) and Y position (in millimeters or mm) showing the surface displacement profile of polycrystalline $Na_{0.86}NbO_{2.93}$ thin film according to various embodiments under an alternating current (AC) unipolar voltage of 4V. Based on the surface displacement value and voltage magnitude applied, the effective piezoelectric coefficient $d_{33}$ is ~1518 pm/V. It is also observed that the effective piezoelectric coefficient depends on the testing frequency, with higher value at lower frequency.

Figure 12:
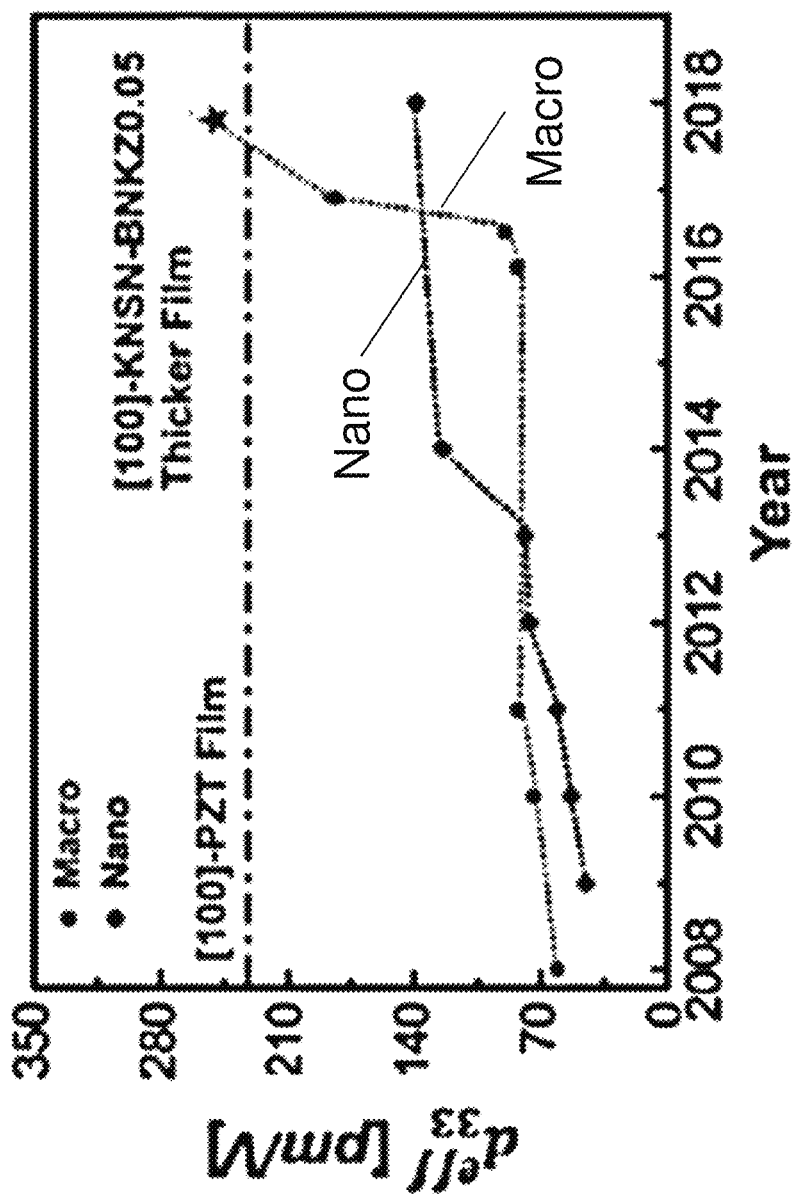
FIG. 12 is a plot of effective longitudinal piezoelectric strain coefficient (in picometers per volt or pm/V) as a function of year illustrating the effective longitudinal piezoelectric strain coefficients of various thin films reported from 2008 to 2018.

Various embodiments may achieve an unusually and unexpectedly high effective longitudinal piezoelectric strain coefficient ($d_{33}$). FIG. 12 is a plot of effective longitudinal piezoelectric strain coefficient (in picometers per volt or pm/V) as a function of year illustrating the effective longitudinal piezoelectric strain coefficients of various thin films reported from 2008 to 2018. As shown in FIG. 12, 0.95(K, Na)(Sb, Nb)$O_3$—0.05(Bi, Na, L)$ZrO_3$ ([100]-KNSN-BNKZ0.05) films may have a $d_{33}$ coefficient of ~250 pm/V. It has also been reported that $(K_{1-x}Na_x)_yNbO_3$ films with $0.4 \leq x \leq 0.7$, $0.7 \leq y \leq 0.94$ may have a $d_{33}$ coefficient of ~220 pm/V.

Various embodiments may have an effective longitudinal piezoelectric strain coefficient ($d_{33}$) of more than 250 pm/V or more than 500 pm/V. Various embodiments may have an effective longitudinal piezoelectric strain coefficient ($d_{33}$) of a value from ~758 pm/V to 1518 pm/V. Various embodiments may relate to epitaxial or polycrystalline films with unique compositions and unprecedentedly high effective piezoelectric coefficients for thin film samples.

The high effective piezoelectric coefficients may offer significantly higher electromechanical response and superior device performance. For instance, an actuator device with the film according to various embodiments may generate a much larger displacement. Various embodiments may have a high Curie temperature, which allows a wider working temperature range, enabling applications in high temperature environments up to 450° C.

Various embodiments may have applications in microelectromechanical system (MEMS) devices such as speakers, inkjet heads, micro-actuators etc. Various embodiments may have applications in electromechanical actuation device, medical ultrasonic transducers, transducers for non-destructive testing and structural health monitoring etc.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. An electromechanical responsive film including:
   a composition including sodium (Na), potassium (K), niobium (Nb) and oxygen (O);
   wherein the composition has a formula of $(Na_xK_y)NbO_{3-\delta}$;
   wherein $0 \leq x < 1$;
   wherein $0 \leq y < 1$;
   wherein $0 < x+y < 1$; and
   wherein the composition satisfies at least one condition selected from a group consisting of a first condition of $(x+y+4)/2 \leq (3-\delta) \leq (x+y+5)/2$ and a second condition of $0 < \delta < 1$.

2. The electromechanical responsive film according to claim 1, wherein the electromechanical responsive film is an epitaxial film.

3. The electromechanical responsive film according to claim 1, wherein the electromechanical responsive film is a polycrystalline film.

4. The electromechanical responsive film according to claim 1, wherein the electromechanical responsive film has an effective longitudinal piezoelectric strain coefficient ($|d_{33}|$) higher than 250 pm/V.

5. The electromechanical responsive film according to claim 4, wherein the effective longitudinal piezoelectric strain coefficient ($|d_{33}|$) is higher than 500 pm/V.

6. The electromechanical responsive film according to claim 1, wherein x is equal to 0.

7. The electromechanical responsive film according to claim 1, wherein y is equal to 0.

8. The electromechanical responsive film according to claim 7, wherein the formula is $Na_{0.86}NbO_{2.93}$.

9. The electromechanical responsive film according to claim 1, wherein the formula is $(K_{0.17}Na_{0.65})NbO_{2.91}$.

10. The electromechanical responsive film according to claim 1, wherein the electromechanical responsive film has a ferroelectric phase-paraelectric phase transition temperature of about 450° C.

11. The electromechanical responsive film according to claim 1, wherein the electromechanical responsive film has an orthorhombic phase-tetragonal phase transition temperature of about 210° C.

12. The electromechanical responsive film according to claim 1, wherein the electromechanical responsive film has a thickness of any value selected from 50 nm to 10 µm.

13. A stacked arrangement including:
    an electromechanical responsive film including a composition including sodium (Na), potassium (K), niobium (Nb) and oxygen (O);
    wherein the composition has a formula of $(Na_xK_y)NbO_{3-\delta}$;
    wherein $0 \leq x < 1$;
    wherein $0 \leq y < 1$;
    wherein $0 < x+y < 1$; and
    wherein the composition satisfies at least one condition selected from a group consisting of a first condition of $(x+y+4)/2 \leq (3-\delta) \leq (x+y+5)/2$ and a second condition of $0 < \delta < 1$.

14. The stacked arrangement according to claim 13, wherein the stacked arrangement includes:
    a substrate;
    a bottom electrode layer on the substrate; and
    a top electrode layer such that the electromechanical responsive film is between the top electrode layer and the bottom electrode layer.

15. The stacked arrangement according to claim 14, wherein the substrate is a silicon wafer including a silicon oxide layer;
    wherein the bottom electrode includes platinum; and
    wherein the electromechanical responsive film is a polycrystalline film of $Na_{0.86}NbO_{2.93}$.

16. The stacked arrangement according to claim 13, wherein the stacked arrangement includes:
    a substrate; and
    an electrode layer such that the electromechanical responsive film is between the electrode layer and the substrate.

17. The stacked arrangement according to claim 16, wherein the substrate includes a single crystal of niobium-doped strontium titanate (Nb-doped $SrTiO_3$); and
    wherein the electromechanical responsive film is an epitaxial film of $Na_{0.86}NbO_{2.93}$ or $(K_{0.17}Na_{0.65})NbO_{2.91}$.

18. A method of forming an electromechanical responsive film, the method including:
    forming the electromechanical responsive film such that the electromechanical responsive film includes a composition including sodium (Na), potassium (K), niobium (Nb) and oxygen (O);
    wherein the composition has a formula of $(Na_xK_y)NbO_{3-\delta}$;
    wherein $0 \leq x < 1$;
    wherein $0 \leq y < 1$;
    wherein $0 < x+y < 1$; and
    wherein the composition satisfies at least one condition selected from a group consisting of a first condition of $(x+y+4)/2 \leq (3-\delta) \leq (x+y+5)/2$ and a second condition of $0 < \delta < 1$.

19. The method according to claim 18, wherein the electromechanical responsive film is formed over a substrate via sputtering.

20. A method of forming a stacked arrangement, the method including:
    forming an electromechanical responsive film including a composition including sodium (Na), potassium (K), niobium (Nb) and oxygen (O);
    wherein the composition has a formula of $(Na_xK_y)NbO_{3-\delta}$;

wherein $0 \leq x < 1$;
wherein $0 \leq y < 1$;
wherein $0 < x+y < 1$; and
wherein the composition satisfies at least one condition selected from a group consisting of a first condition of $(x+y+4)/2 \leq (3-\delta) \leq (x+y+5)/2$ and a second condition of $0 < \delta < 1$.

* * * * *